(12) United States Patent
Ong

(10) Patent No.: US 7,061,263 B1
(45) Date of Patent: Jun. 13, 2006

(54) LAYOUT AND USE OF BOND PADS AND PROBE PADS FOR TESTING OF INTEGRATED CIRCUITS DEVICES

(75) Inventor: Adrian E. Ong, Pleasanton, CA (US)

(73) Assignee: Inapac Technology, Inc., San Jose, CA (US)

( * ) Notice: Subject to any disclaimer, the term of this patent is extended or adjusted under 35 U.S.C. 154(b) by 43 days.

(21) Appl. No.: 10/003,375

(22) Filed: Nov. 15, 2001

(51) Int. Cl.
*G01R 31/26* (2006.01)

(52) U.S. Cl. ........................................ 324/765

(58) Field of Classification Search .............. 324/763, 324/765, 158.1, 73; 714/718, 754, 727
See application file for complete search history.

(56) References Cited

U.S. PATENT DOCUMENTS

| | | | |
|---|---|---|---|
| 4,743,841 A * | 5/1988 | Takeuchi | 324/763 |
| 5,326,428 A | 7/1994 | Farnworth et al. | |
| 5,418,452 A * | 5/1995 | Pyle | 324/158.1 |
| 5,457,400 A | 10/1995 | Ahmad et al. | |
| 5,477,545 A * | 12/1995 | Huang | 714/727 |
| 5,479,105 A | 12/1995 | Kim et al. | |
| 5,506,499 A | 4/1996 | Puar | 324/158 |
| 5,523,697 A | 6/1996 | Farnworth et al. | |
| 5,604,432 A * | 2/1997 | Moore et al. | 324/158.1 |
| 5,619,461 A | 4/1997 | Roohparvar | |
| 5,657,284 A | 8/1997 | Beffa | |
| 5,677,885 A | 10/1997 | Roohparvar | |
| 5,751,015 A | 5/1998 | Corbett et al. | |
| 5,751,987 A | 5/1998 | Mahant-Shetti et al. | |
| 5,801,452 A | 9/1998 | Farnworth et al. | |
| 5,805,609 A | 9/1998 | Mote, Jr. | |
| 5,807,762 A | 9/1998 | Akram et al. | |
| 5,825,697 A | 10/1998 | Gilliam et al. | |
| 5,825,782 A | 10/1998 | Roohparvar | |
| 5,923,600 A | 7/1999 | Momohara | |
| 5,925,142 A | 7/1999 | Raad et al. | |
| 5,936,260 A | 8/1999 | Corbett et al. | |
| 5,959,310 A | 9/1999 | Akram et al. | |
| 5,966,388 A | 10/1999 | Wright et al. | |
| 6,026,039 A | 2/2000 | Kim et al. | |
| 6,072,326 A | 6/2000 | Akram et al. | |
| 6,087,676 A | 7/2000 | Akram et al. | |
| 6,100,708 A | 8/2000 | Mizuta | 324/762 |
| 6,104,658 A | 8/2000 | Lu | |
| 6,137,167 A | 10/2000 | Ahn et al. | |
| 6,154,860 A | 11/2000 | Wright et al. | |
| 6,157,046 A | 12/2000 | Corbett et al. | |
| 6,188,232 B1 | 2/2001 | Akram et al. | |
| 6,191,603 B1 * | 2/2001 | Muradali et al. | 324/765 |
| 6,194,738 B1 | 2/2001 | Debenham et al. | |
| 6,208,157 B1 | 3/2001 | Akram et al. | |
| 6,216,241 B1 | 4/2001 | Fenstermaker et al. | |
| 6,243,839 B1 | 6/2001 | Roohparvar | |

(Continued)

*Primary Examiner*—Jermele Hollington
*Assistant Examiner*—Tung X. Nguyen
(74) *Attorney, Agent, or Firm*—Sidley Austin LLP

(57) ABSTRACT

An integrated circuit die comprising functional circuitry, a plurality of bond pads, each bond pad associated with a respective portion of the functional circuitry and for bonding the respective portion of the functional circuitry, at least one probe pad for testing of the functional circuitry; and multiplexing circuitry between the probe pad and the bond pads, the multiplexing circuitry for multiplexing signals between the probe pad and each of the respective portions of the functional circuitry, thus allowing the respective portions of functional circuitry to be tested using the probe pad and without any contact of the plurality of bond pads by a probe needle.

16 Claims, 9 Drawing Sheets

U.S. PATENT DOCUMENTS

| | | |
|---|---|---|
| 6,243,840 B1 | 6/2001 | Raad et al. |
| 6,274,937 B1 | 8/2001 | Ahn et al. |
| 6,286,115 B1 | 9/2001 | Stubbs |
| 6,294,839 B1 | 9/2001 | Mess et al. |
| 6,298,001 B1 | 10/2001 | Lee et al. |
| 6,300,782 B1 | 10/2001 | Hembree et al. |
| 6,310,484 B1 | 10/2001 | Akram et al. |
| 6,320,201 B1 | 11/2001 | Corbett et al. |
| RE37,611 E | 3/2002 | Roohparvar |
| 6,365,421 B1 | 4/2002 | Debenham et al. |
| 6,366,487 B1 | 4/2002 | Yeom |
| 6,392,948 B1 | 5/2002 | Lee |
| 6,395,565 B1 | 5/2002 | Akram et al. |
| 6,396,291 B1 | 5/2002 | Akram et al. |
| 6,407,566 B1 | 6/2002 | Brunelle et al. |
| 6,441,479 B1 | 8/2002 | Ahn et al. |
| 6,445,625 B1 | 9/2002 | Abedifard |
| 6,456,099 B1 * | 9/2002 | Eldridge et al. ............ 324/754 |
| 6,470,484 B1 * | 10/2002 | Day et al. ...................... 716/8 |
| 6,483,760 B1 | 11/2002 | Kang |
| 6,484,279 B1 | 11/2002 | Akram |
| 6,502,215 B1 | 12/2002 | Raad et al. |
| 6,507,885 B1 | 1/2003 | Lakhani et al. |
| 6,519,725 B1 | 2/2003 | Huisman et al. |

* cited by examiner

LAYOUT AND USE OF BOND PADS AND PROBE PADS FOR TESTING OF INTEGRATED CIRCUITS DEVICES

BACKGROUND OF THE INVENTION

1. Field of the Invention

This invention relates generally to integrated circuits, and more specifically to the layout and use of bond pads and probe pads for testing integrated circuit devices.

2. Related Art

Improvements in semiconductor processing technology have resulted in integrated circuit chips which are more densely populated with microelectronic elements and which provide more functionality than ever before. A chip can be a semiconductor die which is a monolithic structure formed from, for example, silicon or another suitable material.

In the competitive market for integrated circuits, especially for memory devices such as dynamic random access memory (DRAM), it is essential for providers to produce chips which are free of defects. Logic and memory tests are thus performed before a wafer is cut and the die are packaged. A silicon wafer is composed of many separate die. Each die is separated from the adjacent die by a scribe area and each die includes conductive bonding pads. Testing machines typically have a probe card that is lowered to make contact with bonding pads on the wafer in order to test the respective die.

A probe card has multiple needles or pins that lie in a plane with a spacing or pitch between the pins. For the probe pins to make contact with the bonding pads, pressure must be exerted on the pins. If any of the pins is vertically misaligned, additional pressure must be exerted so that all of the pins make contact. The pressure of the pins contacting the surface of the die gouges the bonding pads. Furthermore, in a technique referred to as overdrive, probe pins are made to slide on the surface of the bonding pads in order to remove any aluminum oxide on the surface so that better contact can be achieved. This sliding action results in even larger gouges in the bond pads. Typically, to penetrate the oxide, the probe card and wafer are brought together until the needle probes contact the desired location. The probe card is then "overdriven" a distance which deflects the needle probes and causes them to bend. As the needle probes bend, the ends of the needle probes move horizontally across the bonding pads causing the ends to scrape the surface. This causes the ends to break through the native oxide layer and contact the underlying metal of the bonding pads. The scraping action also displaces some of the metal on the contact location causing a groove and a corresponding ridge.

The gouges in the bond pads resulting from even a single probing operation or "touchdown" weaken subsequent wire bonds to the bond pads. Multiple probing operations and any misalignment of the probe pins can result in severe damage to the bond pads and very poor wire bonding. For most integrated circuits, a wire is bonded to the pad after one or sometimes two touchdowns of the probe pins. However, memory testing may require several touchdowns of the probe pins for numerous reasons including laser repair and subsequent retest.

Small voids can form above the gouges created by one or more touchdowns. These voids between the bond pad and the bond wire create high stress points which may weaken and enlarge over time from thermal cycling, thus resulting in cracks which separate the bond wire from the bond pad. Thermal cycling occurs throughout the life of an integrated circuit device and the failure may occur many years after the initial fabrication and testing.

Semiconductor processing technology is advancing faster than probe card technology. Semiconductor processing technology now allows for a very high density of the integrated circuits and associated bond pads such that, for example, 60 micron bond pads can be spaced with a pitch, or separation between the pads of only 50 microns. Tightly spaced bond pads require probe cards with tightly spaced probe pins, thus the pins must be of a very small diameter. Thinner probe pins are more fragile and can be damaged in the process of testing. Furthermore, probe cards with pins spaced every 50 microns are much more expensive and less durable than standard probe cards with pins spaced about every 100–120 microns.

Another problem with probing the bond pads is that the contact locations on the die necessary for probing are larger than the contact regions needed for wire bonding. In particular, due to the inaccuracies in the x-y placement of the probe pins, the contact locations on the die must be made large enough to accommodate alignment variations between probe cards. This requires that the contact locations be made larger by default, which in turn makes the die larger.

SUMMARY OF THE INVENTION

One aspect of the invention is an integrated circuit die comprising functional circuitry, a plurality of bonding pads, each bond pad associated with a respective portion of the functional circuitry and for bonding the respective portion of the functional circuitry, at least one probe pad for testing of the functional circuitry, and multiplexing circuitry between the probe pad and the bond pads, the multiplexing circuitry for multiplexing signals between the probe pad and each of the respective portions of the functional circuitry, thus allowing the respective portions of functional circuitry to be tested using the probe pad and without any contact of the plurality of bond pads by a probe needle.

Another aspect of the invention is a method of testing functional circuitry of an integrated circuit having a test pad and a plurality of bond pads, each bond pad associated with a respective portion of the functional circuitry and for bonding out the respective portions of the functional circuitry, the method comprising contacting the test pad with a probe needle, and conveying a signal between the probe needle and at least one respective portion of the functional circuitry via the test pad, thus allowing the respective portions of functional circuitry to be tested using the test pad and without any contact of the plurality of bond pads by the probe needle.

A further aspect of the invention is a method of testing functional circuitry of an integrated circuit die comprising providing a probe pad on the integrated circuit die for a plurality of bonding pads, the probe pad for testing the functional circuitry, the bonding pads for boding out respective portions of the functional circuitry, and providing switching circuitry on the integrated circuit die for multiplexing signals between the probe pad and the respective portions of the functional circuitry, thereby allowing the respective portions of functional circuitry to be tested without any contact of the bonding pads by a probe needle.

Yet another aspect of the invention is a method of testing a plurality of integrated circuit dies arranged in rows on a wafer, each integrated circuit die having probe pads along one edge, the method comprising contacting the probe pads of integrated circuit dies on two rows of the wafer simultaneously with a plurality of probe needles of a probe arm, and conveying respective signals between the probe needles and the contacted probe pads of the integrated circuit dies.

A more complete understanding of the present invention will be afforded to those skilled in the art, as well as a realization of the advantages thereof, by a consideration of the following detailed description of one or more embodiments. Reference will be made to the drawings that will first be described briefly.

DETAILED DESCRIPTION OF THE INVENTION

In order to avoid bonding to a bond pad that has been damaged by the probing process, in a first aspect of the invention a probe pad electrically connected to multiple bond pads is provided. In another aspect of the invention, a sacrificial bond pad is used to test the functional circuitry associated with multiple other bond pads. The probe pad or sacrificial bond pad is used to test the circuits and the other bond pads are not contacted by probe needles during testing. As such, a high quality connection to the bond wire can be achieved, and separation of the bond wire from the bond pads can be avoided or minimized. Thus, a more reliable chip with less field failures is fabricated. In a competitive market where reliability is a distinguishing factor, a reduced failure rate is essential.

Multiplexing or switchably connecting the bond pads and the probe pads allows testing of multiple circuits with a single probe or bond pad. Further, the test pad (either probe or bond) can be located remotely from the circuitry that is being tested. One aspect of the invention includes probe pads located on one side of the die used to test circuit elements on an opposite side and on the ends of the die. This, together with efficient layout of the test pads, allows a single arm of the probe card to test multiple dies at once, according to another aspect of the invention. The probe pads can be used for testing after the regular bond pads are bonded to the package substrate (which is connected directly to an ASIC die or other chips of a multichip module) during final assembly. The probe pads can intern be bonded to external pins. Probe pad location may be conveniently placed for optimized substrate (package) routing that may be far from where the normal bond pads need to be to connect to the ASIC die (or other chips in the package). Thus, the probe pads that were initially used for testing the die may be used as bond pads after subsequent packaging of the die into larger assemblies.

A further aspect of the invention is oversizing of the probe pad relative to the bond pad to ensure that any error in the x-y placement of the probe pins is accommodated and does not result in a false test result.

Figure 1:
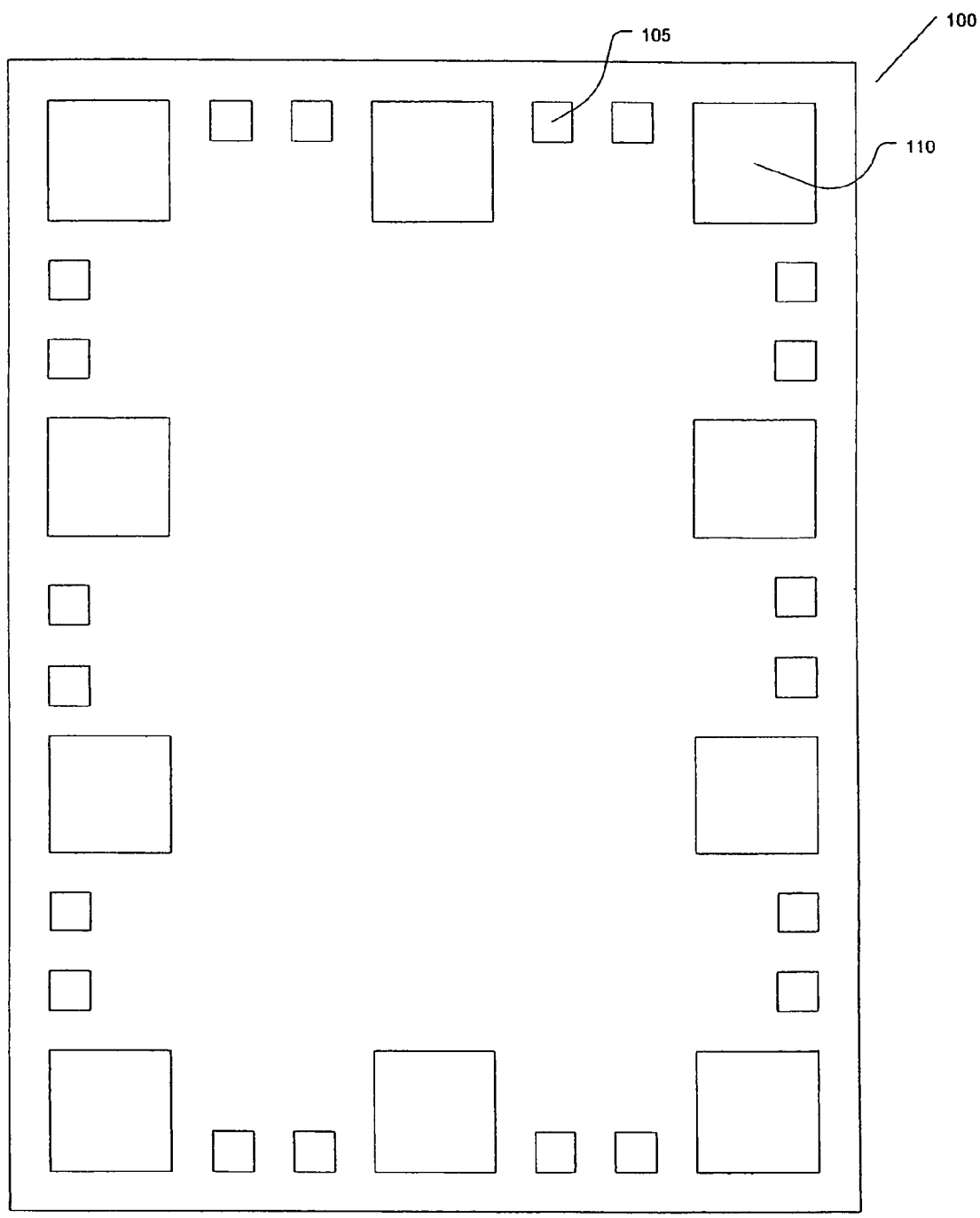
FIG. 1 is a plan view of an exemplifying integrated circuit die, according to an embodiment of the present invention.
Figure 2:
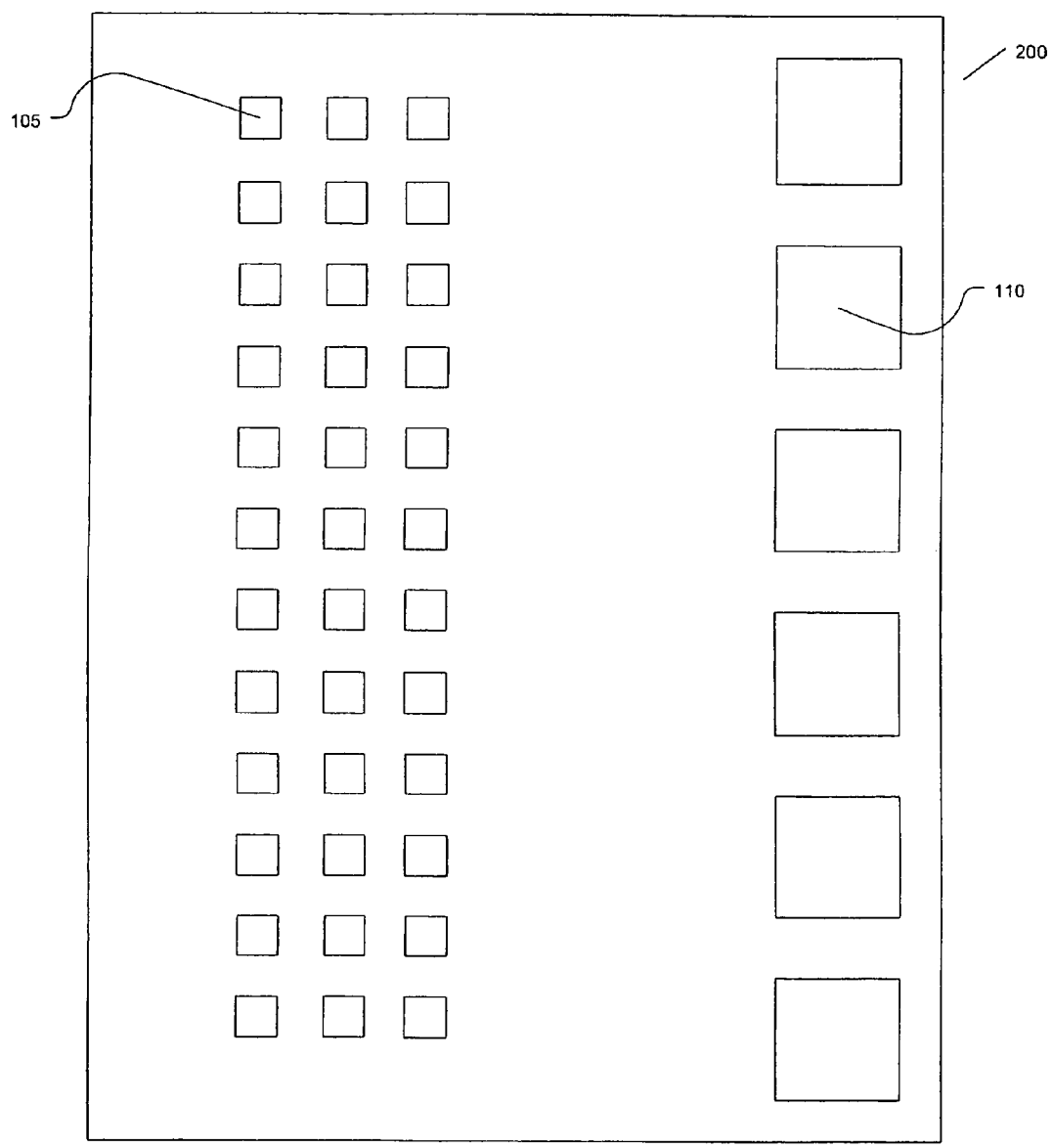
FIG. 2 is a plan view of another exemplifying integrated circuit die, according to an embodiment of the present invention.
Figure 3:
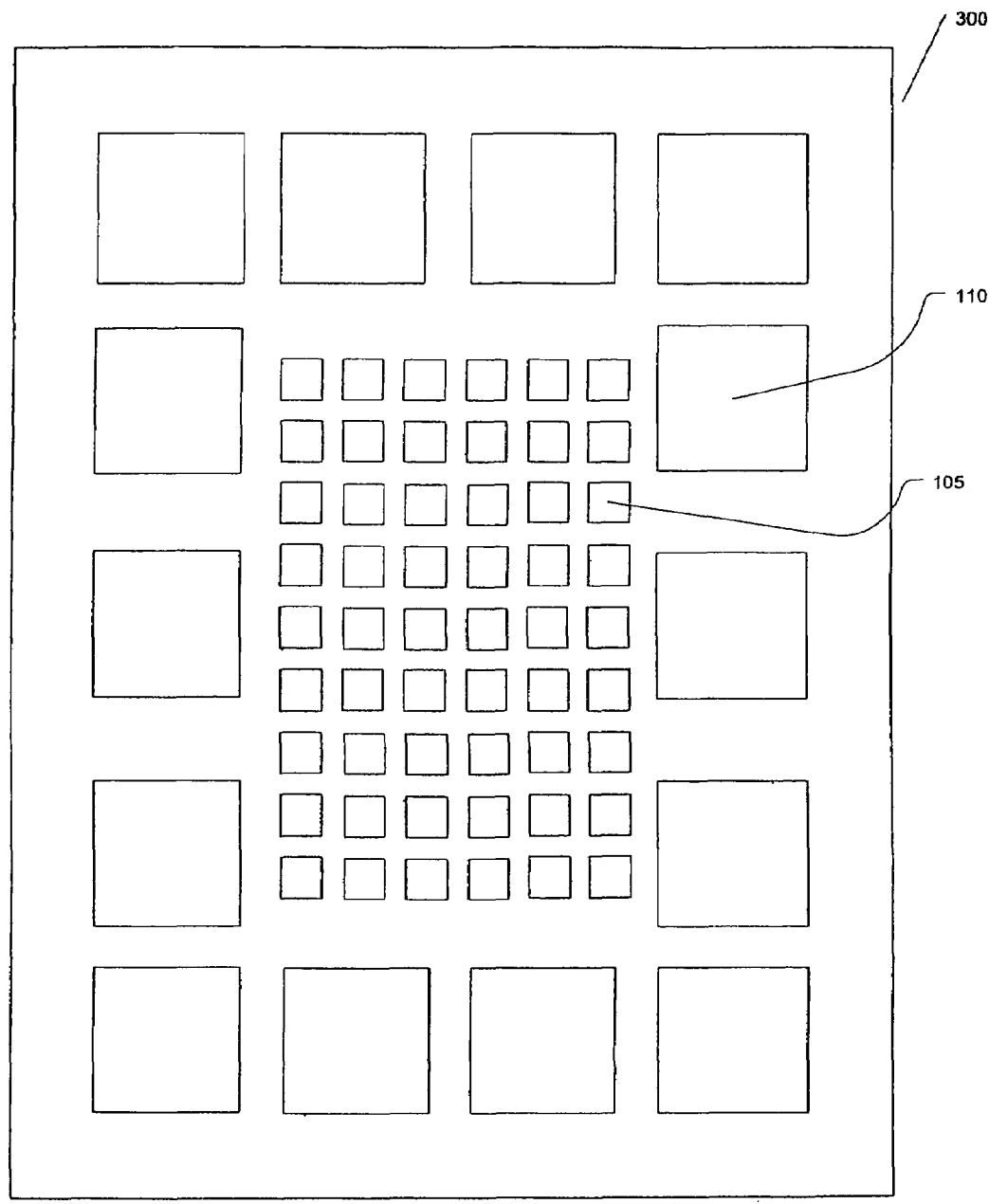
FIG. 3 is a plan view of yet another exemplifying integrated circuit die, according to an embodiment of the present invention.

Many variations in the arrangement of the bond and/or probe pads on an integrated circuit die are within the scope of the present invention. FIGS. 1–3 illustrate three different variations.

Referring to FIG. 1, an integrated circuit die 100 represents any type of integrated circuit die that requires testing, such as, for example, by automated test equipment or an integrated circuit tester. For example, integrated circuit device 100 can be any type of random access memory such as dynamic random access memory (DRAM), static RAM (SRAM), synchronous DRAM (SDRAM), non-volatile RAM (NVRAM), read only memory (ROM), erasable programmable ROM (EPROM), electrically erasable programmable ROM (EEPROM), and flash memory.

Furthermore, the present invention is applicable to other types of integrated circuit devices. For example, the present invention is also applicable to logic chips, such as gate arrays or programmable logic devices, and processor or specialized chips, such as an application specific integrated circuit (ASIC), a microprocessor, a microcontroller, or a digital signal processor (DSP).

As depicted, integrated circuit die 100 has a number of bond pads 105 (only some of which for clarity are labeled) and probe pads 110 (only one of which for clarity is labeled) on the face of the die. Some bond pads 105 can be located at one edge of the integrated circuit die 100, while other bond pads 105 can be located at an opposite edge of the die 100. In this embodiment, probe pads 110 are shown as being larger than bond pads 105. However, in other embodiments, probe pads 110 may be the same size or larger than bond pads 105. A larger probe pad provides ore margin of error, and thus greater tolerance for misplacement, of a probe pin during testing. A larger probe pad also generally allows for a greater pitch between the probe pads, thus allowing more space between pins in a probe card. Probing involves touching a probe pin to a test pad, which can be either a dedicated probe pad or a bond pad. For the purposes of the application, the term "test pad" refers to either a bond pad or a dedicated probe pad which is used during testing of the integrated circuit die. If a relatively small, dedicated probe pad is used, or if a bond pad is used as a probe pad, the pitch of the probe pads can be around 100 microns, which allows the usage of standard pitch probe cards rather than requiring more expensive, non-standard pitch probe cards.

Both bond pads 105 and probe pads 110 are located at the edges of die 100. In one embodiment, each probe pad 110 may be provided for two or more bond pads 105. Each probe pad 110 can be used to test the functional circuitry associated with corresponding plurality of bond pads 105. Testing of the functional circuitry is described below in more detail with regard to FIGS. 4–9.

Another exemplifying integrated circuit die 200 is shown in FIG. 2. As depicted, die 200 has bond pads 105 generally arranged at one edge of the die 200, while probe pads 110 are arranged along an opposite edge of die 200. Again, each probe pad 110 may be provided for a plurality (e.g., six) of bond pads 105. Bond pads 105 can be spaced more closely than probe pads 110. The pitch of the bond pads 105 may be 50 microns or less; the pitch of the probe pads may be greater than 50 microns and can be about 100–120 microns.

Referring to FIG. 3, another exemplifying integrated circuit die 300 is shown. Die 300 has probe pads 110 arranged around its edges, while bond pads 105 are located proximate its center. In this arrangement, each group of four bond pads 105 may be associated with a respective probe pad 110.

Figure 4:
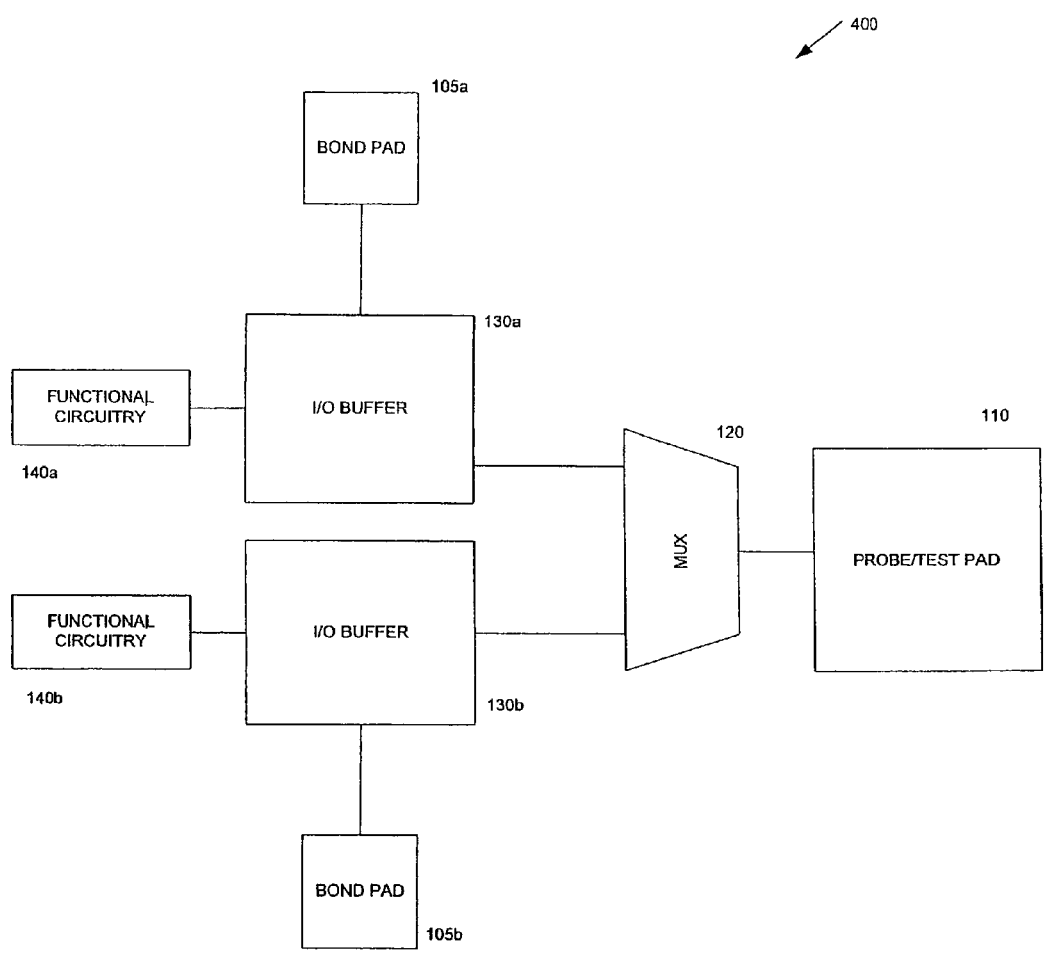
FIG. 4 is a schematic block diagram of a testing configuration, according to an embodiment of the present invention.

FIG. 4 is a schematic block diagram of a testing configuration 400, according to an embodiment of the present invention. The use of a probe pad 110 for testing the functional circuitry 140 associated with multiple bond pads 105 is shown in this embodiment. In testing configuration 400, a functional circuitry block 140a is electrically coupled to an associated bond pad 105a through a respective input/output (I/O) buffer 130a. Likewise, functional circuitry block 140b is electrically coupled to an associated bond pad 105b through a respective I/O buffer 130b. Bond pads 105a and 105b can be bonded out for the input and output of data to and from the respective functional circuitry blocks 140a and 140b.

Functional circuitry blocks 140a and 140b may comprise any number of microelectronic components which are intended to provide some kind of functionality, such as memory or logic. For example, functional circuitry block 140a and 140b may include a block or array of memory cells, each of which functions to store a bit of data.

Buffers 130a and 130b are electrically coupled to the input terminals of a multiplexer (MUX) 120. The output terminal of MUX 120 is coupled to probe pad 110. During testing, test data may be generated by functional circuitry blocks 140a and 140b. A signal for conveying the test data from functional circuitry block 140a is driven by I/O buffer 140a. A different test signal for conveying the test data from functional circuitry block 140b is driven by I/O buffer 130b. The test signals are multiplexed by MUX 120 and the output signal is sent to probe pad 110. A probe pin of a testing apparatus is brought into contact with probe pad 110. The output signal from MUX 120 is picked up by the probe pin. In this way, test configuration 400 allows the functional circuitry blocks 140a and 140b associated with multiple bond pads 105a and 105b to be tested without any contact to the bond pads 105, thereby avoiding any damage to the same. Although only two functional circuitry blocks are illustrated, this configuration also allows for multiplexing test signals from additional functional circuitry blocks.

Figure 5:
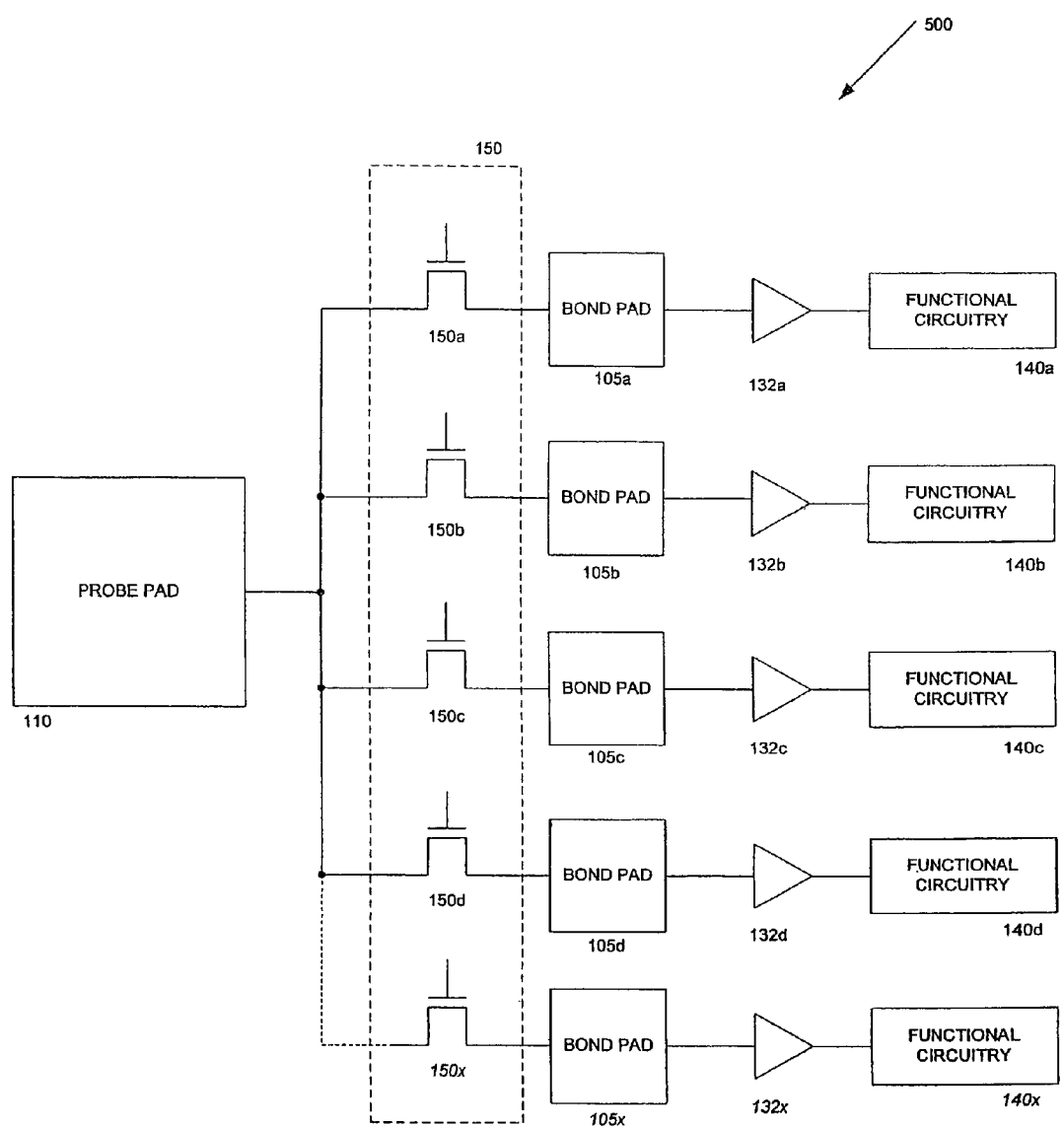
FIG. 5 is a schematic block diagram of a testing configuration, according to an embodiment of the present invention.

FIG. 5 is a schematic block diagram of a testing configuration 500, according to an embodiment of the present invention. In testing configuration 500, a probe pad 110 is connected to an array of switches 150 (separately labeled 150a, 150b, 150c, 150d, . . . 150x). As shown, each switch 150 can be implemented as a transistor. At least five switches are illustrated, but the array can contain more or less. In one embodiment, the number of switches 150 which are provided may be equal to the number of bond pads 105x on the integrated circuit die. Additionally, although a transistor is illustrated, any type of switch can be used. Each switch 150 is electrically coupled to a respective bond pad 105 (separately labeled 105a, . . . ) on the circuit die. Each bond pad 105a, 105b, 105c, 105d, . . . 105x is electrically coupled to a respective functional circuitry block 140 (separately labeled 140a, 140b, 140c, and 140d . . . 140x) through a respective driver or buffer 132 (separately labeled as 132a, 132b, 132c, and 132d . . . 132x). In one embodiment, each buffer 132 can be implemented with a tri-state driver.

A test signal or pattern is introduced to the integrated circuit die through a pin of a probe card in contact with probe pad 110. To test the operation of any particular functional circuitry block 140, the respective switch 150 is closed and the remaining switches 150 are opened. The test signal then passes through the associated bond pad 105 and is driven by buffer 132a into the desired functional circuitry block 140. This embodiment as illustrated by testing configuration 500 can be used to test the functional circuitry associated with all of the bond pads 105 of an integrated circuit die. In this way, none of the bond pads 105 are contacted by a probe pin during testing, and thus they remain in an optimal state for subsequent wire bonding.

Figure 6:
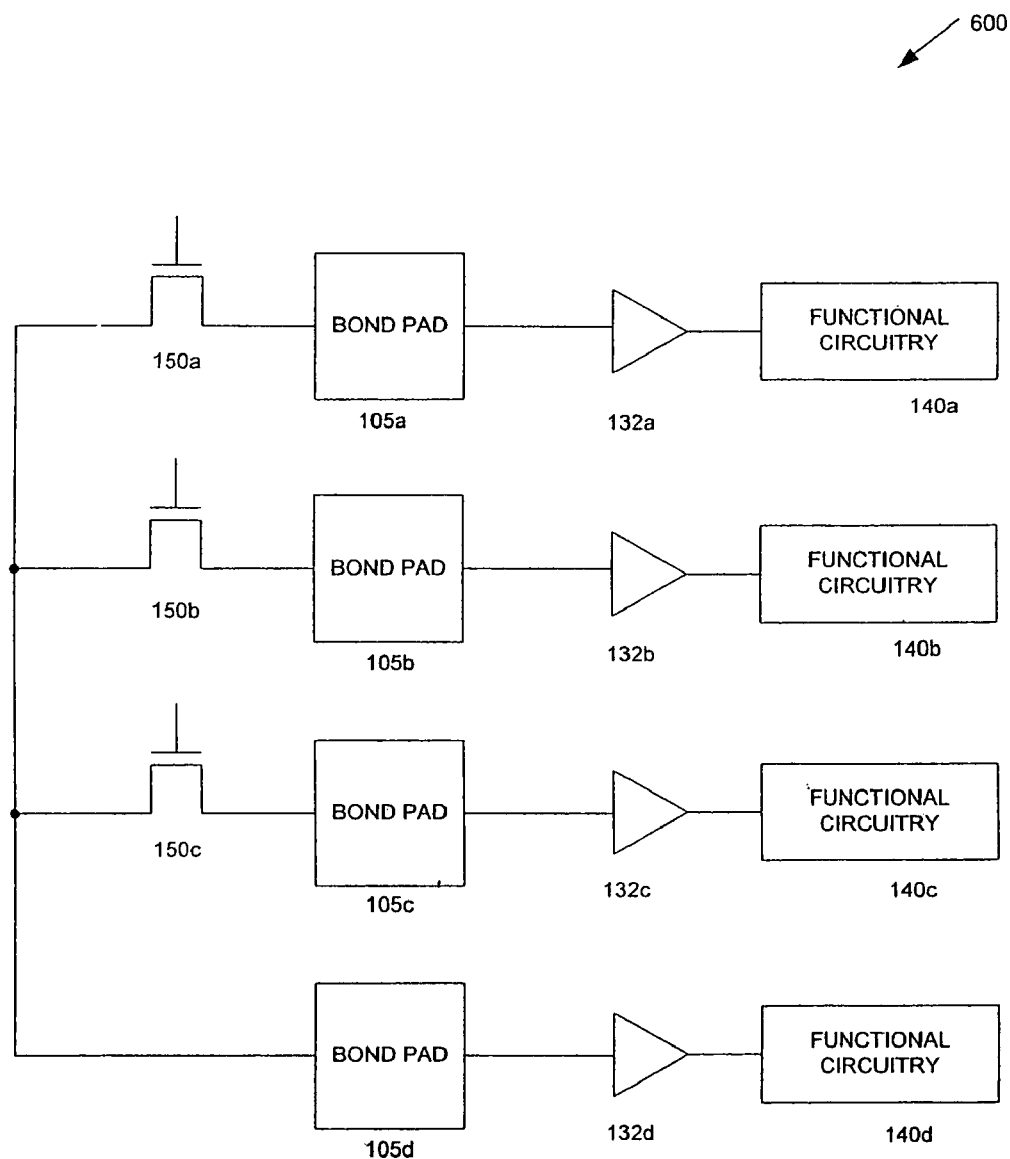
FIG. 6 is a schematic block diagram of a testing configuration, according to an embodiment of the present invention.

FIG. 6 is a schematic block diagram of a testing configuration 600, according to an embodiment of the present invention. In this embodiment, a bond pad 105d may be "sacrificed" as a testing pad for testing of the functional circuitry block 140d associated with that bond pad as well as the functional circuitry blocks 140a, 140b, and 140c associated with other bond pads 105a, 105b, and 105c. In order to test functional circuitry block 140d, switches 150a, 150b, and 150c are then opened, and a test signal is introduced through a probe pin in contact with bond pad 105d. This test signal is driven by a buffer 132d to functional circuitry block 140d.

To test another functional circuitry block 140 (i.e., 140a, 140b, or 140c), the respective switch 150 is closed and the remaining switches are opened. The probe pin is brought into contact with bond pad 105d and the test signal is transmitted through the closed switch 150, the respective bond pad 105 and buffer 132 into the desired functional circuitry block 140.

In testing configuration 600, contact by a probe pin is made with only one bond pad 105 out of a group of bond pads 105, thereby limiting any resultant damage to the contacted bond pad 105 while allowing the functional circuitry blocks 140 associated with the other bond pads 105 to be tested. Although this example illustrates the use of one bond pad 105 to test the circuitry associated with four bond pads, additional functional circuitry blocks associated with additional bond pads 105 on the circuit die can be tested by contacting only one bond pad according to this embodiment of the invention. Because only one bond pad of a group of bond pads is used to test the circuitry, the pitch of the probe needles can be increased, and a standard probe card can be used. For example, if the pitch between adjacent bond pads 105 in a row is 50 microns and only one out of four bond pads is used for testing, the pitch between adjacent probe pins can be 200 microns. Thus, a standard, less expensive, and more durable probe card can be used for testing of an integrated circuit die, even one with a very high density of microelectronics. This configuration is also advantageous because no additional metal layer is required for providing dedicated probe pads, while a large percentage of bond pads are not contacted by any probe pins prior to bonding operations.

Figure 7:
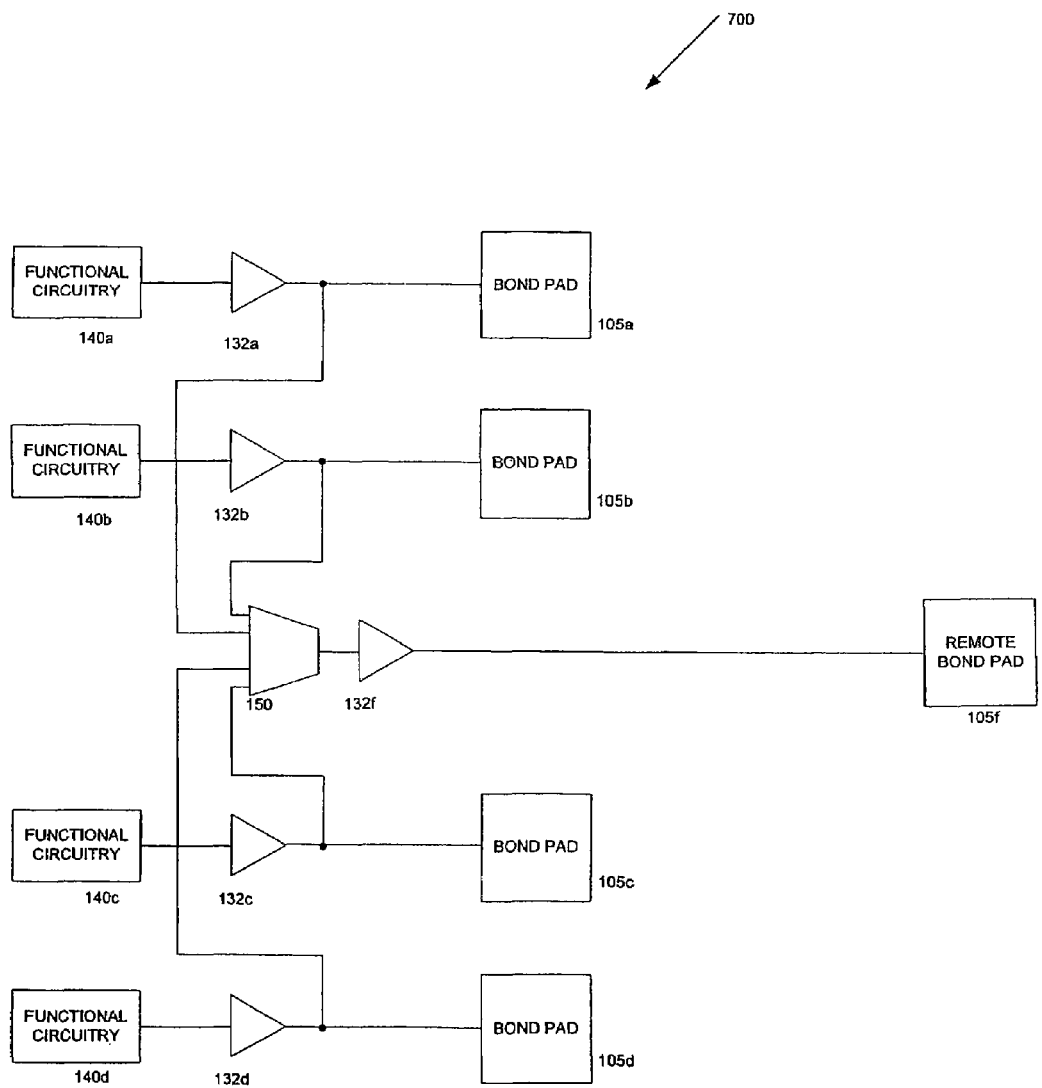
FIG. 7 is a schematic block diagram of a testing configuration, according to an embodiment of the present invention.

FIG. 7 is a schematic block diagram of a testing configuration 700, according to an embodiment of the present invention. In this embodiment, a signal conveying test data from any functional circuitry blocks 140a, 140b, 140c, or 140d is provided to a probe pin in contact with bond pad 105f, which can be remote from the bond pads 105a, 105b, 105c, or 105d associated with circuitry blocks 140a, 140b, 140c, and 140d. As shown in FIG. 1, such bond pad 105f may be located on one edge of an integrated circuit die which is distal from another edge on which the other bond pads 105 are located. Thus, in testing configuration 700, a bond pad in one area of the circuit die, a "remote bond pad," may be used to test the functional circuitry associated with bond pads in another area of the circuit die. Bond pads 105a–105d are coupled to functional circuitry blocks 140a–140d through-buffers 132a–132d respectively. The test signals from functional circuitry blocks 140a–140d are driven by buffers 132a–132d respectively to MUX 150 and multiplexed by MUX 150. The multiplexed signal is driven by buffer 132f to the remote bond pad 105f. Thus, the functional circuitry associated with four bond pads at one edge or area of the integrated circuit die can be tested by probing a bond pad at a different edge or area of the circuit die. Thus, all of the functional circuitry of an integrated circuit die can be tested by making contact with only one edge or area of the circuit die, as will be described in further detail with regard to FIG. 9. Use of a remote bond or probe pad allows for flexibility in the arrangement of the pads, and thus allows for flexibility in the selection and arrangement of probe cards within the probe head.

Figure 8:
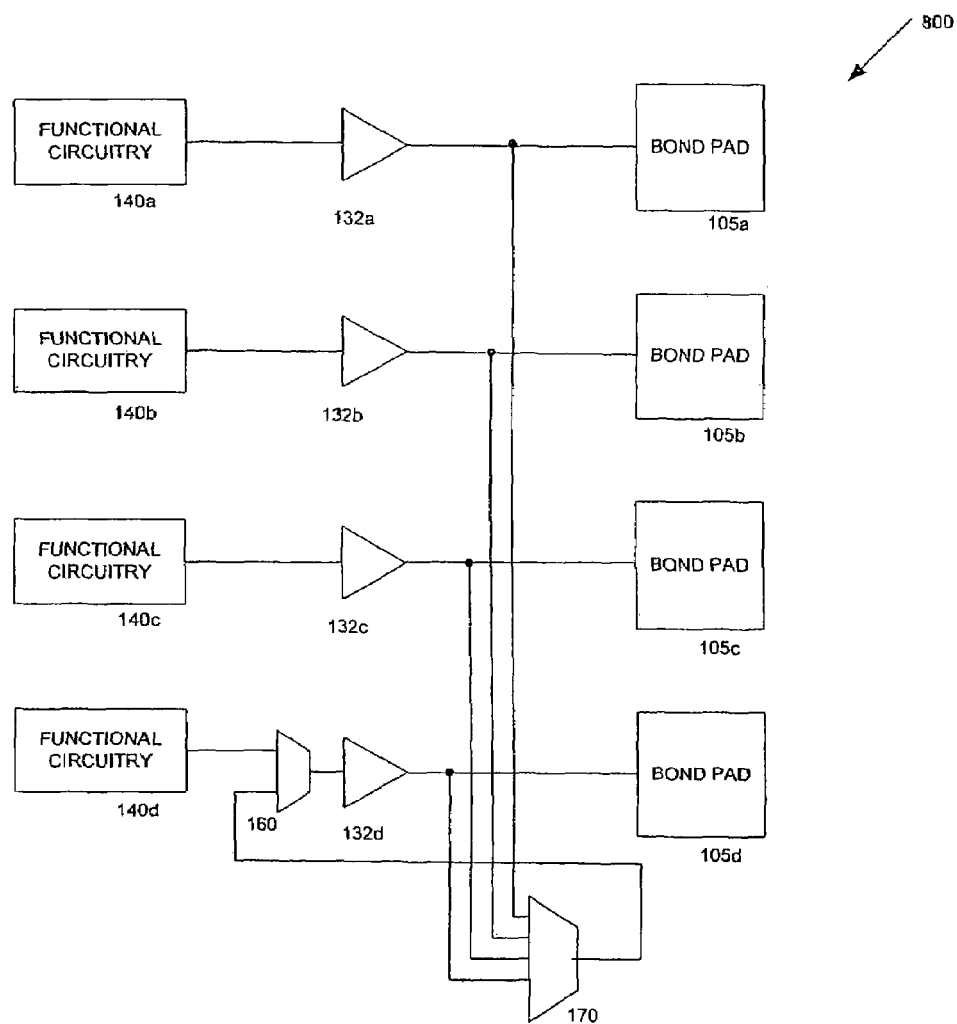
FIG. 8 is a schematic block diagram of a testing configuration, according to an embodiment of the present invention.

FIG. 8 is a schematic block diagram of a testing configuration 800, according to an embodiment of the present invention. In this embodiment, a signal for conveying test data from any of functional circuitry blocks 140a, 140b, 140c, or 140d is driven by a respective buffer 132a, 132b, 132c, or 132d to a first multiplexer (MUX) 170. Multiplexer 170 multiplexes the output signals from buffers 132 and transmits the multiplexed signal to a second multiplexer 160. Multiplexer 160 multiplexes the output of multiplexer 170 with a signal from functional circuitry block 140d and generates a multiplexed signal which is driven by buffer 132d. A probe pin in contact with a bond pad 105d associated with functional circuitry block 140d can therefore test the functional circuitry associated with each of bond pads 105a, 105b, 105c, and 105d. Therefore, bond pads 105a, 105b, 105c, and 105d remain unmarred by the touchdown of the probe pin and a subsequent wire bond to those bond pads will not be adversely affected by any damage to these bond pads.

Figure 9:
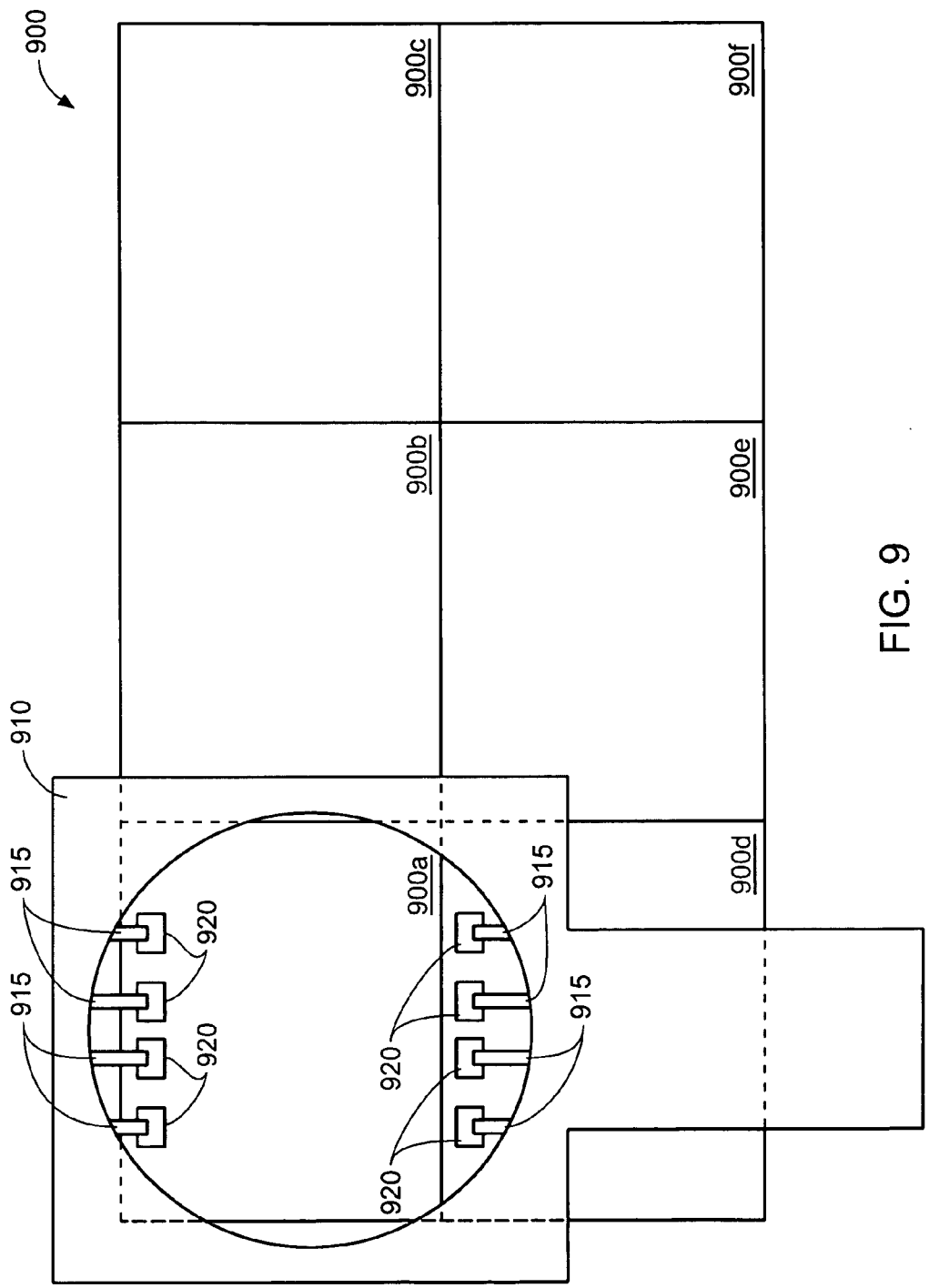
FIG. 9 illustrates a probe card contacting the probe or bond pads of multiple dies of a wafer.

FIG. 9 illustrates a probe card or head 910 touching down onto a portion 900 of a wafer. This wafer includes circuit die 900a, 900b, and 900c in a first row and circuit die 900d, 900e, and 900f in an adjacent second row. Probe card 910 has a number of probe pins 915 arranged at the upper and lower edges of an aperture. When the probe card 910 is lowered to the surface of the wafer, probe pins 915 make contact with test pads 920 of circuit die 900a and 900d. Efficient arrangement of the test pads, whether they are a subset of bond pads used for testing or dedicated probe pads, allows circuit die in adjacent rows or columns of the wafer to be tested simultaneously, thereby resulting in significant time saving during a testing operation in which many touchdowns of the probe head 910 take place.

In the various embodiments described herein, the arrangement of test pads (either dedicated probe pads or a subset of bond pads) and/or multiplexing of the test signals may provide greater efficiency when testing the functional circuitry of one or more integrated circuit dies. Furthermore, the use of one test pad to test the functional circuitry associated with many bond pads reduces or eliminates the damage associated with touchdowns of a probe card/head on the bond pads, and therefore allows for more optimal bonding operations for the integrated circuit die after testing. Embodiments of the invention also allow for a larger pitch between the test pads, and thereby enables the use of a standard probe card which is less fragile and more economical than a probe card with pins arranged more closely together. This is even more advantageous as integrated circuit processing technology results in ever denser circuitry that requires significant testing and bond pads which are even more tightly spaced.

While particular embodiments of the present invention and their advantages have been shown and described, it should be understood that various changes, substitutions, and alterations can be made therein without departing from the spirit and scope of the invention as defined by the appended claims. For example, any number of arrangements of the bond and probe pads on an integrated circuit die is within the scope of the invention. As another example, other combinations of switches, buffers, probe pads, and multiplexers than are shown in the embodiments are also possible as defined in the appended claims.

I claim:

1. An integrated circuit die comprising:
   functional circuitry;
   a plurality of bond pads, each bond pad associated with a respective portion of the functional circuitry and for bonding the respective portion of the functional circuitry;
   at least one probe pad for testing of the functional circuitry; and
   multiplexing circuitry between the probe pad and the bond pads, the multiplexing circuitry for multiplexing signals between the probe pad and each of the respective portions of the functional circuitry, thus allowing the respective portions of functional circuitry to be tested using the probe pad and without any contact of the plurality of bond pads by a probe needle.

2. The integrated circuit die of claim 1 wherein the multiplexing circuitry comprises a plurality of switching devices, each switching device coupled between the probe pad and a respective one of the bond pads.

3. An integrated circuit die comprising:
   functional circuitry;
   a plurality of bond pads, each bond pad associated with a respective portion of the functional circuitry and for bonding the respective portion of the functional circuitry;
   at least one probe pad for testing of the functional circuitry;
   multiplexing circuitry between the probe pad and the bond pads, the multiplexing circuitry for multiplexing signals between the probe pad and each of the respective portions of the functional circuitry, thus allowing the respective portions of functional circuitry to be tested using the probe pad and without any contact of the plurality of bond pads by a probe needle, and
   a plurality of tri-state drivers for driving signals in the integrated circuit die, each tri-state driver coupled between a respective one of the bond pads and an associated portion of functional circuitry.

4. An integrated circuit die comprising:
   functional circuitry;
   a plurality of bond pads, each bond pad associated with a respective portion of the functional circuitry and for bonding the respective portion of the functional circuitry;
   at least one probe pad for testing of the functional circuitry;
   multiplexing circuitry between the probe pad and the bond pads, the multiplexing circuitry for multiplexing signals between the probe pad and each of the respective portions of the functional circuitry, thus allowing the respective portions of functional circuitry to be tested using the probe pad and without any contact of the plurality of bond pads by a probe needle, and
   a respective input/output buffer for each bond pad.

5. The integrated circuit die of claim 1 wherein the functional circuitry comprises memory circuitry.

6. The integrated circuit die of claim 1 wherein the functional circuitry comprises logic circuitry.

7. The integrated circuit die of claim 1 wherein the probe pad is substantially the same size as each bond pad.

8. The integrated circuit die of claim 1 wherein the probe pad is larger than each bond pad.

9. The integrated circuit die of claim 1 wherein the distance between adjacent bond pads is about 50 microns or less.

10. The integrated circuit die of claim 1 wherein the probe pad is provided along one edge of the integrated circuit die and the bond pads are provided at an opposing edge of the integrated circuit die.

11. A method of testing functional circuitry of an integrated circuit die comprising:
providing a probe pad on the integrated circuit die for a plurality of bonding pads, the probe pad for testing the functional circuitry, the bonding pads for bonding out respective portions of the functional circuitry; and
providing switching circuitry on the integrated circuit die for multiplexing signals between the probe pad and the respective portions of the functional circuitry, thereby allowing the respective portions of functional circuitry to be tested without any contact of the bonding pads by a probe needle.

12. The method of claim 11 wherein the switching circuitry comprises a multiplexer.

13. The method of claim 11 wherein the switching circuitry comprises a demultiplexer.

14. The method of claim 11 wherein the probe pad is substantially the same size as each bonding pad.

15. The method of claim 11 wherein the probe pad is larger than each bonding pad.

16. The method of claim 11 wherein the probe pad is provided along one edge of the integrated circuit die and the bonding pads are provided at an opposing edge of the integrated circuit die.

* * * * *